United States Patent
Vincent et al.

(10) Patent No.: US 10,159,169 B2
(45) Date of Patent: Dec. 18, 2018

(54) FLEXIBLE EQUIPMENT FRONT END MODULE INTERFACES, ENVIRONMENTALLY-CONTROLLED EQUIPMENT FRONT END MODULES, AND ASSEMBLY METHODS

(71) Applicant: Applied Materials, Inc., Santa Clara, CA (US)

(72) Inventors: Joseph Vincent, Bangalore (IN); Michael Kuchar, Georgetown, TX (US); Dean C. Hruzek, Cedar Park, TX (US); Vijayabaskar Soundarrajan, Bangalore (IN); Pandu Maddherla, Bangalore (IN); Adam J. Wyatt, Round Rock, TX (US); Robert M. McAndrew, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 193 days.

(21) Appl. No.: 15/336,279

(22) Filed: Oct. 27, 2016

(65) Prior Publication Data

US 2018/0124960 A1 May 3, 2018

(51) Int. Cl.
*H05K 13/02* (2006.01)
*H01L 21/67* (2006.01)
(Continued)

(52) U.S. Cl.
CPC ..... *H05K 13/021* (2013.01); *H01L 21/67126* (2013.01); *H01L 21/67201* (2013.01); *H05K 7/1401* (2013.01); *H05K 7/20209* (2013.01)

(58) Field of Classification Search
CPC .............. H05K 13/021; H05K 7/1401; H05K 7/20209; H01L 21/67201; H01L 21/67126
See application file for complete search history.

(56) References Cited

U.S. PATENT DOCUMENTS

| 2004/0203326 A1* | 10/2004 | Lischka | B24B 53/017 451/72 |
| 2008/0019811 A1* | 1/2008 | Krolak | H01L 21/67017 414/304 |

(Continued)

FOREIGN PATENT DOCUMENTS

WO    WO 2016/085622    6/2016

OTHER PUBLICATIONS

International Search Report and Written Opinion of International Application No. PCT/US2017/054935 dated Jan. 11, 2018.

(Continued)

*Primary Examiner* — Jeffrie R Lund
(74) *Attorney, Agent, or Firm* — Dugan & Dugan, PC (57) ABSTRACT

An equipment front end module interface of an equipment front end module including environmental controls. The equipment front end module interface includes a first mounting member configured to couple to a load lock assembly, and a flexible seal coupled to the first mounting member. The flexible seal provides sealing between the equipment front end module and the load lock assembly and also accommodates axial and other misalignment between the load lock assembly and the equipment front end module during assembly. Equipment front end modules including the equipment front end module interface and methods of assembling a load lock assembly to the equipment front end module using the equipment front end module interface are provided, as are other aspects.

20 Claims, 7 Drawing Sheets

(51) Int. Cl.
*H05K 7/14* (2006.01)
*H05K 7/20* (2006.01)

(56) References Cited

U.S. PATENT DOCUMENTS

| | | | |
|---|---|---|---|
| 2008/0118236 A1* | 5/2008 | Anwar | H01L 21/67201 392/411 |
| 2008/0292432 A1 | 11/2008 | Castantini et al. | |
| 2009/0060687 A1* | 3/2009 | White | H01L 21/67126 414/217 |
| 2009/0110518 A1 | 4/2009 | Rice et al. | |
| 2015/0013910 A1* | 1/2015 | Krupyshev | B25J 9/042 156/345.32 |
| 2015/0016941 A1 | 1/2015 | Rice et al. | |
| 2015/0045961 A1 | 2/2015 | Koshti et al. | |
| 2015/0221538 A1 | 8/2015 | Ochiai et al. | |
| 2015/0294888 A1 | 10/2015 | Iwamoto | |
| 2015/0311100 A1 | 10/2015 | Miyajima et al. | |
| 2016/0118279 A1 | 4/2016 | Iyer et al. | |
| 2016/0147235 A1 | 5/2016 | Rice et al. | |
| 2018/0124960 A1* | 5/2018 | Vincent | H05K 7/1401 |

OTHER PUBLICATIONS

Luke W. Bonecutter, U.S. Appl. No. 15/348,967, titled: Systems, Apparatus, and Methods for an Improved Load Port, filed Nov. 10, 2016.

Reuter et al., U.S. Appl. No. 15/348,964, titled: Systems, Apparatus, and Methods for an Improved Load Port Backplane, filed Nov. 10, 2016.

Blahnik et al., U.S. Appl. No. 15/348,947, titled: Electronic Device Manufacturing Load Port Apparatus, Systems, and Methods, filed Nov. 10, 2016.

Luke W. Bonecutter, U.S. Appl. No. 15/348,961, titled: Electronic Device Manufacturing Load Port Apparatus, Systems, and Methods, filed Nov. 10, 2016.

* cited by examiner

FLEXIBLE EQUIPMENT FRONT END MODULE INTERFACES, ENVIRONMENTALLY-CONTROLLED EQUIPMENT FRONT END MODULES, AND ASSEMBLY METHODS

FIELD

Embodiments relate to electronic device manufacturing, and more specifically to equipment front end modules (EFEMs) including environmental control.

BACKGROUND

Electronic device processing systems may include multiple process chambers arranged around a mainframe body including a transfer chamber and one or more load locks configured to pass substrates into the transfer chamber from an EFEM. These systems may employ a transfer robot, which may be resident in the transfer chamber, for example. The transfer robot may transport substrates from process chamber to process chamber, from load lock to process chamber, and vice versa.

Furthermore, processing of substrates in semi-conductor component manufacturing may be carried out in multiple tools, where the substrates travel between the tools in substrate carriers (e.g., Front Opening Unified Pods or FOUPs). The FOUPs may be docked to an EFEM (sometimes referred to as a "factory interface"), which includes a load/unload robot therein and that is operable to transfer substrates between the FOUPs and the one or more load locks of the tool.

However, such EFEMs may be deficient in some respects and in ease of assembly.

SUMMARY

In one embodiment, an equipment front end module interface is provided. The equipment front end module interface includes A first mounting member configured to couple to a load lock assembly, and a flexible seal coupled to the first mounting member, the flexible seal including a sealing flange configured to seal around an interface opening in an equipment front end module.

In another embodiment, an equipment front end module is provided. The equipment front end module includes a cabinet including an equipment front end module chamber subject to environmental controls, the cabinet including a wall with and interface opening, and an equipment front end module interface coupled to the wall, the equipment front end module interface comprising: a first mounting member configured to couple to a load lock assembly, and a flexible seal coupled to the first mounting member, the flexible seal including a sealing flange that is sealed around the interface opening.

In yet another embodiment, a method of assembling a load lock assembly to an equipment front end module is provided. The method includes providing a load lock assembly, providing an equipment front end module including a cabinet with an equipment front end module chamber subject to environmental controls, the equipment front end module cabinet including a wall and an interface opening in the wall, providing an equipment front end module interface including a first mounting member and a flexible seal coupled to the first mounting member, the flexible seal including a sealing flange, coupling and sealing the sealing flange around the interface opening and coupling the first mounting member to the load lock assembly to seal between the load lock assembly and the wall of the equipment front end module cabinet, and accommodating any misalignment present between the load lock assembly and the equipment front end module with the flexible seal.

Numerous other features and aspects are provided in accordance with these and other embodiments of the disclosure. Other features and aspects of embodiments will become more fully apparent from the following detailed description, the appended claims, and the accompanying drawings.

BRIEF DESCRIPTION OF THE DRAWINGS

The drawings, described below, are for illustrative purposes and are not necessarily drawn to scale. The drawings are not intended to limit the scope of the disclosure in any way. Like numerals are used throughout the specification and drawings to denote like elements.

DETAILED DESCRIPTION

Reference will now be made in detail to the example embodiments of this disclosure, which are illustrated in the accompanying drawings. Features of the various embodiments described herein may be combined with each other, unless specifically noted otherwise.

Electronic device processing may, in some embodiments, involve controlling moisture, temperature, oxygen levels, and/or other environmental factors in an EFEM chamber of an EFEM. As used herein these electronic device processing systems including control of one or more of moisture, temperature, oxygen or other gas levels in the EFEM chamber are referred to as having "environmental controls." In some embodiments, EFEMs that do not include environmental controls may be replaced, or otherwise retrofitted, with EFEMs including such environmental controls. In such replacements or retrofits, leakage is a concern, but also the ability to accommodate positional variations between the EFEM and one or more load locks coupled to a mainframe, i.e., the ability to accommodate misalignment. The misalignment may be due to manufacturing variations, differences in overall size of environmentally-controlled EFEMs versus non-environmentally-controlled EFEMs, and/or attempting to use existing mounting locations when making the EFEM retrofit.

To address the above problems, according to one or more embodiments of the disclosure provided herein, an EFEM interface comprising a flexible seal is provided. The EFEM interface may be part of an environmentally-controlled EFEM. In particular, in one or more embodiments, the EFEM interface includes a first mounting member configured to couple to a load lock assembly, and a flexible seal coupled to the first mounting member. The flexible seal may include a sealing flange configured to seal around an interface opening, such as on a front wall of the environmentally-controlled EFEM. Thus, one advantage is that the EFEM interface provided in accordance with embodiments of the disclosure creates a gas-tight seal between the cabinet of the EFEM and the load lock assembly so that effective environment control may be carried out within the EFEM chamber by confining the environment within the EFEM chamber and isolating the EFEM chamber from contaminants present in the factory environment outside of the EFEM.

In another advantage, the EFEM interface allows misalignment correction capability between the EFEM and the load lock assembly so that upon assembly of the EFEM to the load lock assembly, any misalignment (e.g., axial misalignment) between the load lock assembly and the EFEM may be easily accommodated. Stresses imparted to the connected components may also be minimized. Lateral and/or vertical misalignment may also be accommodated. Tilting between the EFEM and the load lock assembly may also be accommodated.

In another embodiment of the disclosure, an EFEM including one or more EFEM interfaces is provided, as are methods of assembly of an EFEM to a load lock assembly.

Further details of example apparatus, systems, and method embodiments are described with reference to FIGS. 1A-4 herein.

Figure 1A:
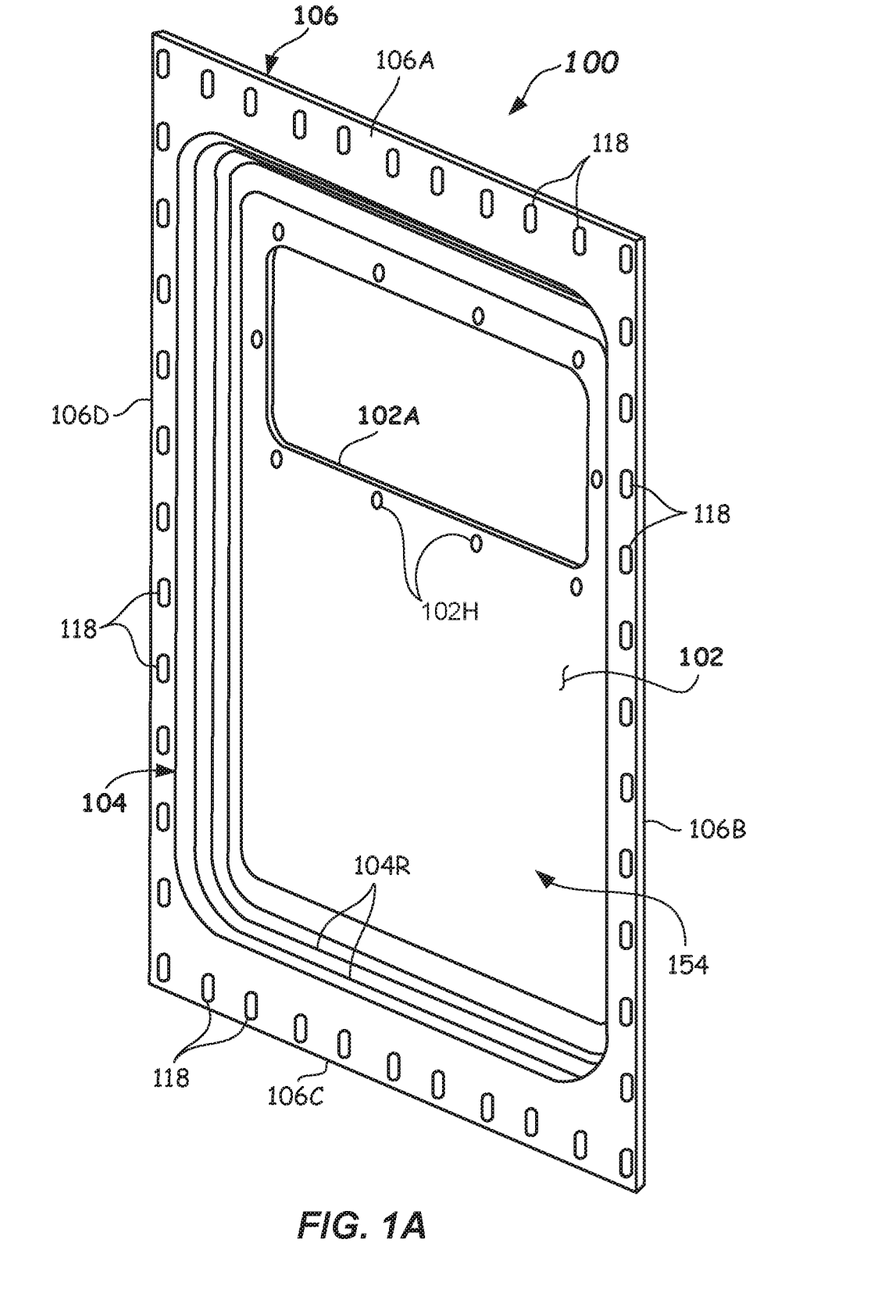
FIG. 1A illustrates an isometric view of an EFEM interface according to one or more embodiments.
Figure 1B:
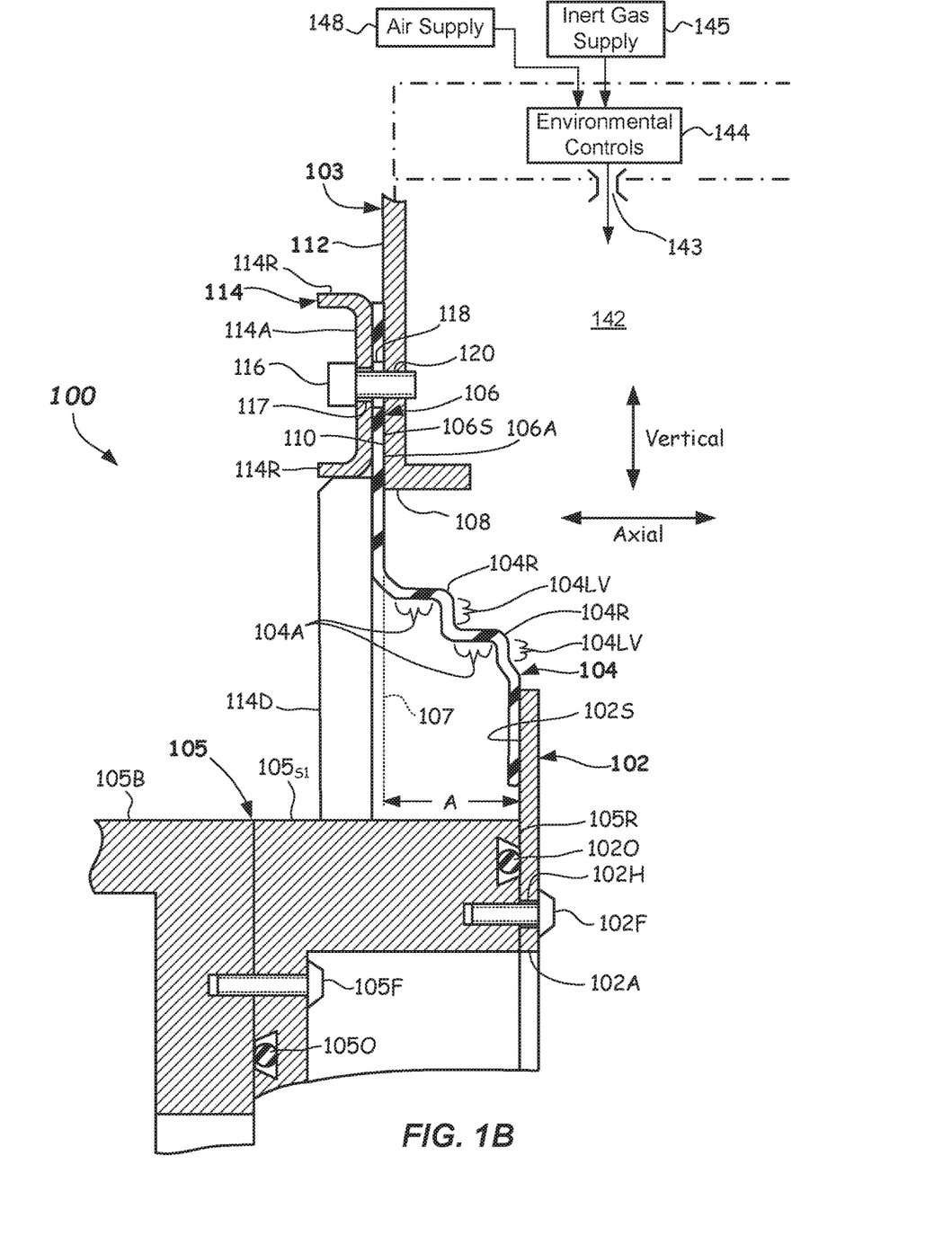
FIG. 1B illustrates a partial cross-sectioned side view of an EFEM interface coupled to an EFEM and load lock of an electronic device processing system according to one or more embodiments.

FIGS. 1A-1B illustrate isometric and cross-sectioned views, respectively, of an example embodiment of an EFEM interface 100 according to the present disclosure. The EFEM interface 100 is useable, and has utility for, interfacing between an EFEM 103 and a load lock assembly 105 in an electronic device processing system 101 (See FIG. 1D) that is configured for processing substrates. Substrates as used herein means articles used to make electronic devices or electronic circuit components (e.g., computer chips), such as silicon-containing wafers (e.g., 300 mm or 450 mm wafers), patterned or un-patterned wafers, masked wafers, or the like.

In more detail, the EFEM interface 100 may include a first mounting member 102 configured to couple to a first side of the load lock assembly 105. The first mounting member 102 may be a rectangular plate including a substrate opening 102A configured to receive substrates there through. The first mounting member 102 is also configured to couple to the load lock assembly 105 about the substrate opening 102A. The substrate opening 102A may be located on an upper half of the rectangular plate, as will be described with reference to FIG. 3. The substrate opening 102A may include holes 102H (a few labeled) around a periphery thereof for securing the first mounting member 102 to the load lock assembly 105. More specifically, the first mounting member 102 may attached to a first slit valve assembly $105_{s1}$ comprising part of the load lock assembly 105, such as by first fasteners 102F. A first O-ring seal 102O may provide a gas-tight seal between the first mounting member 102 and the first slit valve assembly $105_{s1}$. The first mounting member 102 may be attached to a first slit valve assembly $105_{s1}$, which may be coupled to the load lock body 105B by second fasteners 105F. A second O-ring seal 105O may seal between the first slit valve assembly $105_{s1}$ and the load lock body 105B.

EFEM interface 100 further includes a flexible seal 104 coupled to the first mounting member 102. The flexible seal 104 may be made of any suitable flexible elastomer material, such as Nitrile, Fluorocarbon, Neoprene, or the like. The coupling to the first mounting member 102 may be provided by any suitable means, such as a bonded joint, where the flexible seal 104 is integrally bonded to a first sealing surface 102S (e.g., a front surface) of the first mounting member 102. The bond may be cold-formed or hot-formed bond, for example.

In one or more examples, the shape of the flexible seal 104 may be formed in a mold (e.g., a compression or injection mold). The shape of the flexible seal 104 may include a series of ridges 104R that extend around the outer periphery of the first mounting member 102. The ridges 104R may connect respective ones of the axially-extending portions 104A and laterally-extending and vertically-extending portions 104LV to form a bellows structure that surrounds the first mounting member 102. Axially-extending portions 104A may be angled from a pure axial direction in some embodiments. Laterally-extending or vertically-extending portions 104LV may be angled from pure vertical and/or pure lateral directions in some embodiments.

The flexible seal 104 may include a sealing flange 106, including an outer gasket portion configured to seal against the EFEM 103. The sealing flange 106 may include interconnected flange portions 106A-106D that are configured to extend around, and to seal, an interface opening 108 formed in a wall 109 (e.g., front wall—FIG. 1D) of the EFEM 103. Each of the flange portions 106A-106D may be formed to be located along and overlap a respective peripheral edge of the interface opening 108. The sealing flange 106 may be about 1 mm to 3 mm thick and about 10 mm to 20 mm wide, for example. Other dimensions may be used depending on the $O_2$ level, relative humidity level, and other contaminant levels in the EFEM. The sealing flange 106 may include a plurality of mounting apertures 118 (a few labeled) formed therein. At least some or all of the plurality of mounting apertures 118 may be elongated. For example, the plurality of mounting apertures 118 may be elongated so that they may be about 10 mm wide and 18 mm long, for example. The elongation is provided to for manufacturing tolerances. Other dimensions may be used for different sized EFEMs and load locks. In some embodiments, all of the plurality of mounting apertures 118 may be elongated in the same direction, such as vertically as shown.

Interface opening 108 may be rectangular in shape, for example. Other shapes may be used. The sealing flange 106 may be configured to seal against a sealing surface 110 of an interface panel 112, as shown in FIG. 1B. The sealing surface 110 is located around the interface opening 108 of the EFEM 103 as shown. The sealing surface 110 may be about 10 mm to 20 mm wide surrounding the interface opening 108 and may comprise a smooth surface having Ra of less than about 64 µin (less than about 1.6 µm) using a profilimeter, for example. Other sizes and surface roughness may be used depending on EFEM and/or load lock size and sealing levels sought.

Figure 1C:
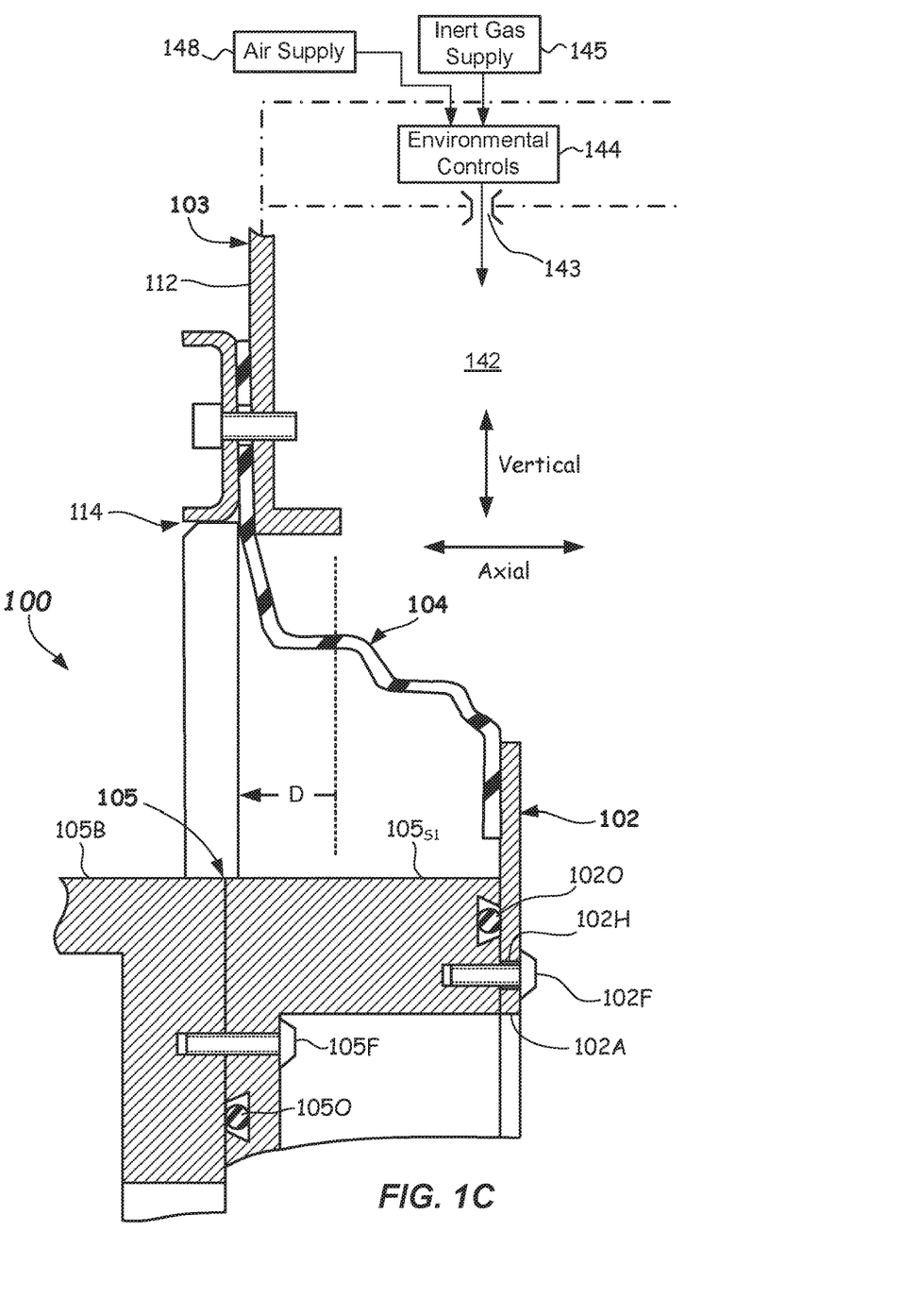
FIG. 1C illustrates a partial cross-sectioned side view of an EFEM interface shown accommodating axial misalignment between an EFEM and load lock according to one or more embodiments.
Figure 1D:
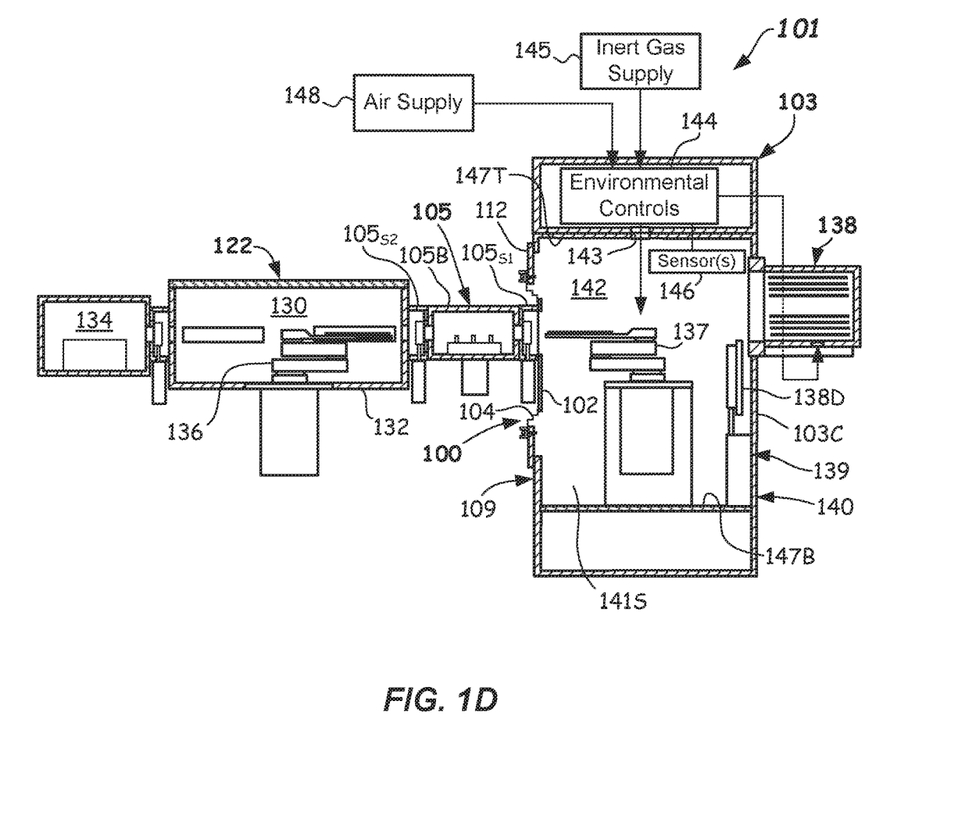
FIG. 1D illustrates a schematic cross-sectioned side view of an electronic device processing system including an EFEM interface shown accommodating misalignment between an EFEM and load lock according to one or more embodiments.
Figure 2:
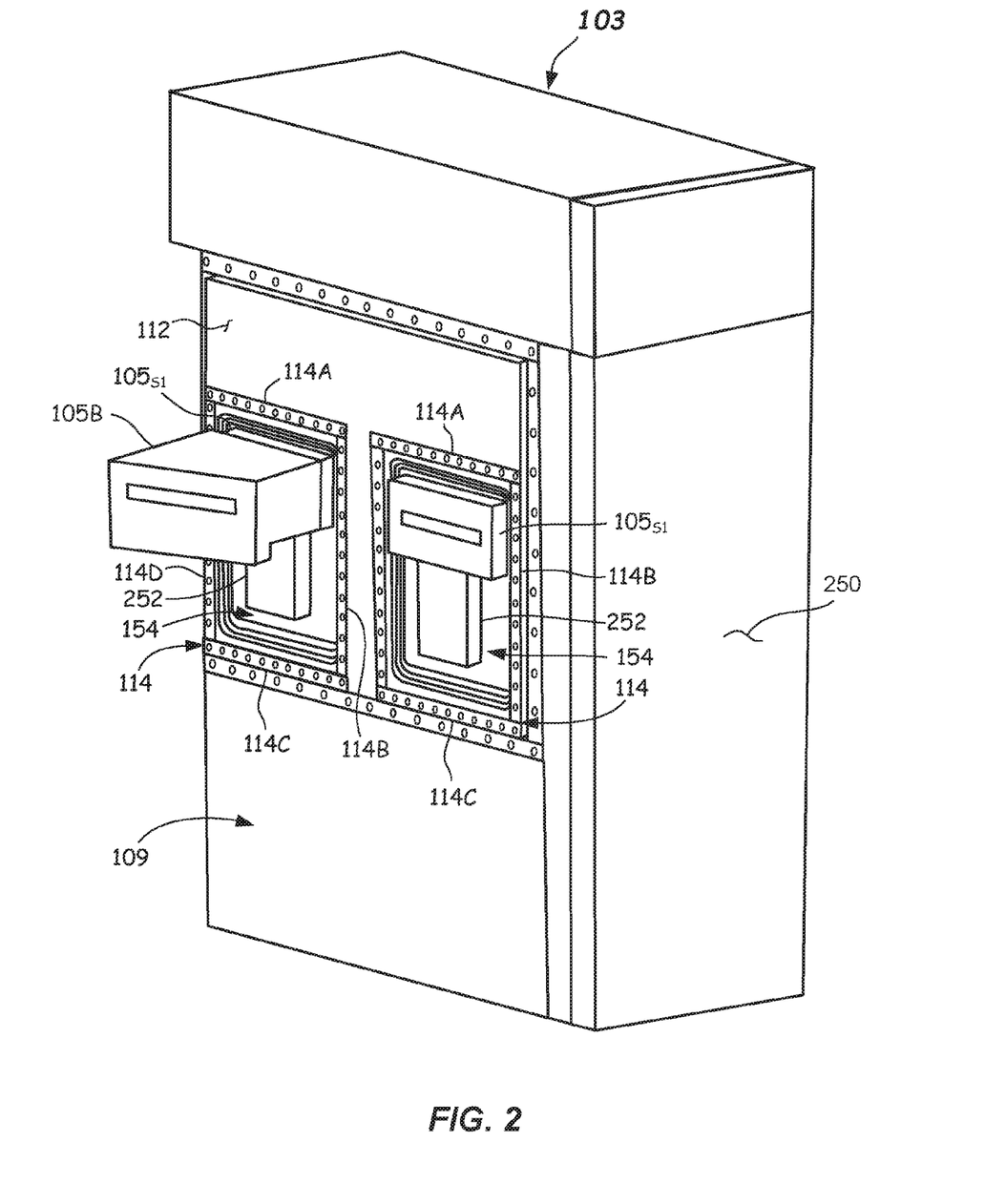
FIG. 2 illustrates an isometric view of an EFEM including multiple EFEM interfaces coupled to an interface panel of the EFEM according to one or more embodiments.

The interface panel 112, as best shown in FIG. 1D and FIG. 2, may be a flat plate that constitutes some or all of the wall 109 (e.g., a front wall) of the EFEM 103. The interface panel 112 may also be a planar panel coupled to, and sealed to, other parts of the wall 109. Any suitable means for attaching and sealing the interface panel 112 to the rest of the wall 109 may be used, such as fasteners and gaskets around the periphery of the interface panel 112, or the like as shown in FIG. 2.

Again referring to FIG. 1B, a seal between the sealing flange 106 and the sealing surface 110 of the interface panel 112 may be formed by using a clamp 114. Clamp 114 may be secured against an outer surface of the sealing flange 106 around the outer-most periphery of the flexible seal 104. As shown in FIG. 1B and FIG. 2, multiple clamping strips 114A-114D may make up the clamp 114. Optionally, the clamp 114 may be one integral hoop-like piece or other multi-piece clamp configurations. The clamp 114 exerts a compressive sealing force against the outer (front) surface of the sealing flange 106. In particular, third fasteners 116 may be received through bores 117 in the clamping strips 114A-114D, through the plurality of mounting apertures 118 formed in the sealing flange 106, and threaded into threaded bores 120 formed in the interface panel 112. Tightening the third fasteners 116 compresses the sealing flange 106 axially to form a gas-tight seal between the second sealing surface 106S of the sealing flange 106 and the sealing surface 110 of the interface panel 112.

In the depicted embodiments, the clamping strips 114A-114D may be linear strips extending along the respective top, right, bottom, and left sides of the interface opening 108. The clamping strips 114A-114D may be metal strips including bent portions comprising end ribs 114R. Multiple ones of the third fasteners 116 may be associated with, and secure, each of the clamping strips 114A-114D by being received through the bores 117 therein and threaded into threaded bores 120.

The flexible seal 104 provides a gas-tight seal at the interface of the flexible seal 104 with the interface panel 112, but also with the first mounting member 102. Additionally, as is explained below, the flexible seal 104 allows axial misalignment between an installed location of the EFEM 103 and an installed location of the load lock assembly 105 (e.g., as attached to a mainframe 122—FIG. 2).

Again referring to FIG. 1B, a location of a rear surface 105R of the load lock assembly 105 (and first sealing surface 102S of the first mounting member 102) relative to the front surface 107 of the interface panel 112 (and second sealing surface 106S of the flexible seal 104) is shown in a nominal position, with the flexible seal 104 being shown in an un-flexed condition. In the unflexed condition, a first plane of the first sealing surface 102S of the first mounting member 102 and a second plane of a second sealing surface 106S of the flexible seal 104 are offset axially from one another. The nominal (e.g., molded) axial offset (A) may be greater than about 10 mm, or even greater than about 25 mm, for example, and between about 10 mm and 35 mm in some embodiments. Other axial offset (A) may be provided depending upon the size of the EFEM.

FIG. 1C illustrates an offset position of the front surface 107 of the interface panel 112 of the EFEM 103 relative to the nominal position (shown in FIG. 1B). FIG. 1C illustrates the EFEM interface 100 installed in a condition where the EFEM 103 is axially offset from the nominal position towards the load lock assembly 105 by an axial offset distance D. This, the flexible seal 104 is flexed axially and elongated to accommodate the axial misalignment. Axial alignment away from the load lock assembly 105 may also be accommodated. Lateral misalignment and vertical misalignment as well as tilting misalignment can also be accommodated. For example, greater than +/−10 mm axial misalignment D may be accommodated, such as +/−15 mm, +/−20 mm, +/−25 mm, or even more. Furthermore, +/− greater than 10 mm lateral and/or vertical misalignment may be accommodated. Furthermore, greater than +/−2 degrees tilting misalignment, or even +/− greater than 3 degrees tilting misalignment may be accommodated. Other amounts of misalignment may be accommodated depending upon the size of the EFEM.

As shown in FIG. 1D, one configuration of an electronic device processing system 101 including the EFEM 103 and the coupled EFEM interface 100 is shown. The first mounting member 102 is shown coupled to an outer member of the first slit valve assembly $105_{s1}$ of the load lock assembly 105. The connection may be sealed, such as by the first O-ring seal 102O, or optionally by a gasket, sealing compound, or the like. The first slit valve assembly $105_{s1}$ may be coupled to a load lock body 105B on a first side and a second slit valve assembly $105_{s2}$ may be coupled on the second side of load lock body 105B. The first and second slit valve assemblies $105_{s1}$, $105_{s2}$ each include an outer member, an actuator, and a slit valve door operable by the actuator. The second slit valve assembly $105_{s2}$ may be coupled to a mainframe body 132 of the mainframe 122. These connections between the load lock body 105B and second slit valve assembly $105_{s2}$ and between the second slit valve assembly $105_{s2}$ and the mainframe body 132 may also be sealed. Mainframe 122 may include a transfer chamber 130 and a plurality of process chambers 134 (a single one shown) surrounding the mainframe body 132. The plurality of process chambers 134 may be accessible from the transfer chamber 130. Any suitable construction of the load lock assembly 105 allowing transfer of substrates between the transfer chamber 130 and the EFEM 103 may be used.

A transfer robot 136 may deliver substrates to the plurality of processing chambers 134 for processing. Processing may include deposition, etching, cleaning, coating (e.g., nitride coating), and/or the like. Other processes may be carried out in the mainframe 122 and processing chambers 134. After processing, the substrates may be delivered by the transfer robot 136 back to the load lock assembly 105, and subsequently transferred through the EFEM 103.

The transfer through the EFEM 103 from the load lock assembly 105 may deliver the substrates to one or more substrate carriers 138 that may be docked to another wall (e.g., a back wall 140) of the EFEM 103. The transfer may be accomplished by a load/unload robot 137 located in an EFEM chamber 142, for example. Any suitable robot type may be used for the transfer robot 136 and the load/unload robot 137. For example, multi-arm robots may be used, such as selective compliance articulated robot arm (SCARA) robots, or the like. The EFEM chamber 142 is formed by the walls (including the wall 109 (front wall), back wall 140, side walls 141S, top wall 147T, and bottom walls 147B) of the cabinet 103C.

During the substrate transfer through the EFEM 103, the environment of the EFEM chamber 142 may be controlled. The environment may be controlled such that the substrate is not exposed, even for a short time, any appreciable amount of an unwanted constituent. For example, in the depicted embodiment, the EFEM chamber 142 may be coupled with environmental controls 144 configured to provide an environmentally-controlled atmosphere to the EFEM Chamber 142. In particular, environmental controls 144 may include a controller, one or more valves, and one or more conduits. Environmental controls 144 may be coupled to the EFEM chamber 142 and operational to monitor and/or control environmental conditions within the EFEM chamber 142. Controller may include suitable processor, memory, and electronic components for receiving inputs from one or more sensor(s) 146 and controlling one or more valves. In some embodiments, and at certain times, the EFEM chamber 142 may receive an inert gas through inlet 143. The inert gas may be argon, nitrogen gas ($N_2$), helium, or mixtures thereof. A supply of dry nitrogen gas ($N_2$) may be quite effective. In other embodiments, gas purge of the substrate carrier 138 may also take place at certain times using the environmental controls 144.

In more detail, the environmental controls 144 may control at least one of: 1) relative humidity (RH), 2) temperature (T), 3) an amount of $O_2$, or 4) an amount of inert gas, contained within the EFEM chamber 142. Other environmental conditions of the EFEM 103 may be monitored and/or controlled, such as gas flow rate or chamber pressure or both. Flow rate and chamber pressure may be monitored to determine leakage and/or failure of the flexible seal 104 of the gas-tight seal between the EFEM 103 and the load lock assembly 105.

Environmental controls 144 may, in one or more embodiments, monitor certain parameters in the EFEM chamber 142 or at an exit conduit therefrom. For example, in some embodiments, relative humidity (RH) in the EFEM chamber 142 may be monitored with a sensor 146, such as a relative humidity sensor. In some embodiments, environmental controls 144 monitor RH, and when a measured RH value is above a predefined RH threshold value, carrier doors 138D of the one or more substrate carriers 138 coupled to load ports of the EFEM 103 are caused not to open (stay closed) via non-operation of the carrier door opener 139. Carrier doors 138D of the substrate carriers 138 may be opened when the measured RH value falls below the predefined RH threshold value.

The RH may be lowered by flowing any suitable amount of an inert gas from the inert gas supply 145 into the EFEM chamber 142. Compressed dry bulk inert gases, having relatively low $H_2O$ levels (e.g., less than about 5 ppm water), may be supplied from an inert gas supply 145. In another embodiment, one or more load lock assemblies 105 may remain closed until the RH falls below the pre-defined reference value. In one or more embodiments, the predefined reference relative humidity value may be less than 1000 ppm moisture, less than 500 ppm moisture, or even less than 100 ppm moisture, depending upon the level of moisture that is tolerable for the particular process being carried out in the electronic device processing system 101. The EFEM interface 100 minimizes entry of any contaminants through the connection point between the EFEM 103 and the load lock assembly 105.

In some embodiments, the environmental controls 144 may include an air supply 148 coupled thereto to supply air (e.g., clean, dry air) to the EFEM chamber 142. The air supply 148 may be coupled by suitable conduits and one or more valves to the EFEM chamber 142. The environmental controls 144 may include a sensor 146, such as an oxygen sensor, that is configured and adapted to sense a level of oxygen ($O_2$) within the EFEM chamber 142. Thus, when an operator seeks to enter the EFEM chamber 142, and initiates an entry request, the controller of the environmental controls 144 may initiate a flow of air from the air supply 148 such that some of the inert gas environment is exhausted and replaced with air. When a level of oxygen detected within the EFEM chamber 142 reaches a suitable pre-defined $O_2$ level, a door interlock keeping an access door 250 (FIG. 2) closed may be unlatched to allow the access door 250 to be opened and thus allow the operator access to the EFEM chamber 142 for service.

In another example, environmental preconditions may be met, for example, when a measured oxygen ($O_2$) level in the EFEM chamber 142, as sensed by sensor 146 (e.g., an oxygen sensor) falls below a predefined oxygen threshold level (e.g., less than 50 ppm $O_2$, less than 10 ppm $O_2$, less than 5 ppm $O_2$, or even less than 3 ppm $O_2$, or even lower). Other suitable oxygen level thresholds may be used, depending on the processing taking place in the processing chambers 134. If the predefined oxygen threshold level in the EFEM chamber 142 is not met, the controller will initiate a control signal to release inert gas from the inert gas supply 145 into the EFEM chamber 142 until the predefined oxygen threshold level is met. When the predefined oxygen threshold level is met, the carrier door 138D of the substrate carrier 138 and/or the slit valve door 351 (FIG. 3) of the first slit valve assembly 105$_{s1}$ may be opened. This helps to ensure that substrates within the substrate carriers 138 that are opened, a load lock chamber of the load lock assembly 105 that is opened, as well as any substrates passing through the EFEM chamber 142 are exposed to relatively low oxygen levels, which may have a detrimental effect on the substrates.

In another example, environmental preconditions may be met, for example, when a measured temperature level in the EFEM chamber 142, such as a temperature as sensed by sensor 146 (e.g., a temperature sensor) is met or exceeded. For example, a predefined temperature threshold level may be set. Once the predefined temperature threshold level is met, inert gas flow may be provided from the inert gas supply 145 to the EFEM chamber 142.

Figure 3:
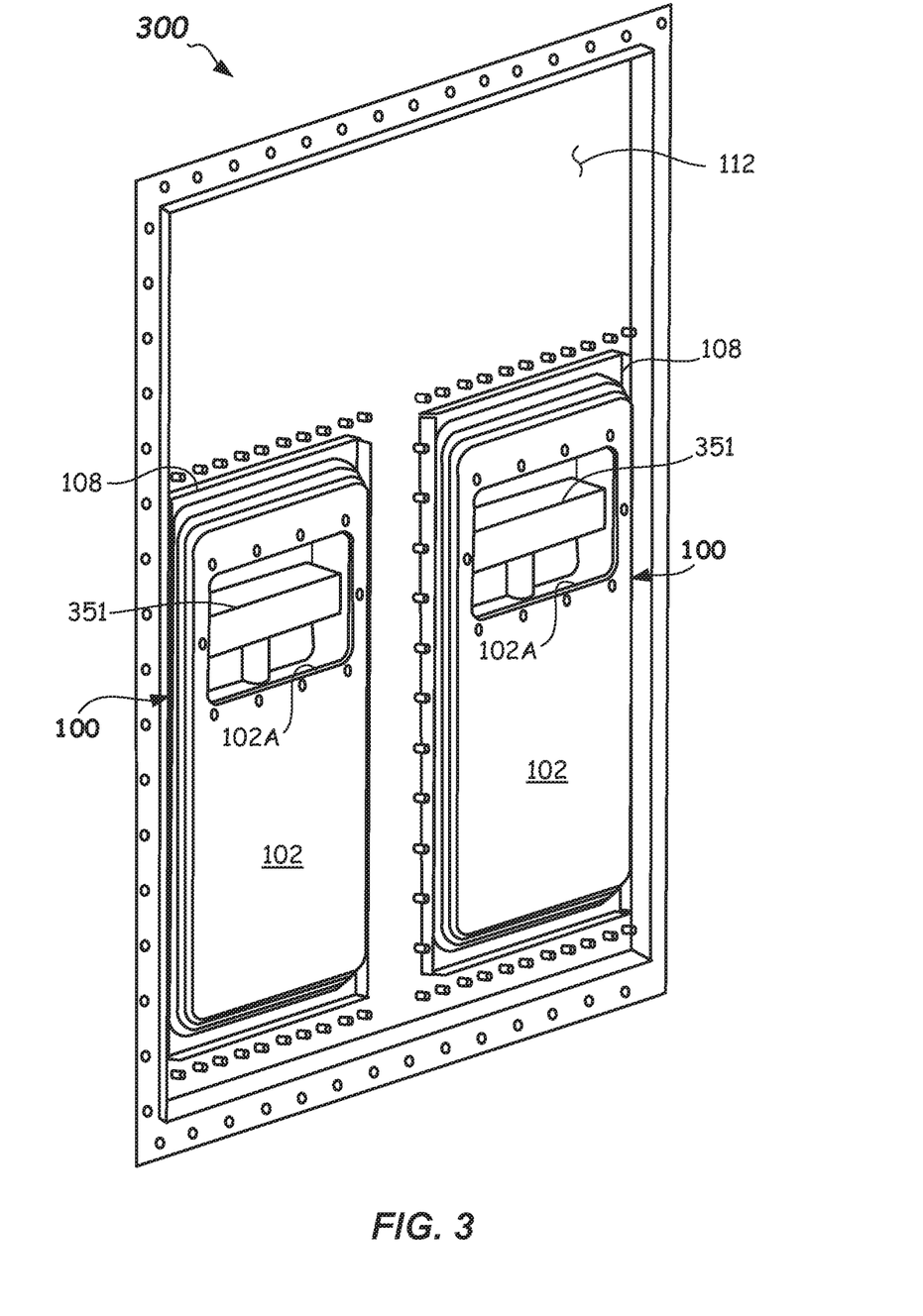
FIG. 3 illustrates a rear isometric view of an interface panel including a plurality of EFEM interfaces coupled thereto according to one or more embodiments.

FIG. 3 illustrates an interface subassembly 300 comprising the interface panel 112 and two EFEM interfaces 100 coupled thereto. Each of the EFEM interfaces 100 include a first mounting member 102 with a substrate opening 102A formed therein. In the depicted embodiment, the substrate opening 102A is offset vertically on the first mounting member 102 and an actuator 252 of the slit valve assembly 105$_{s1}$ is received in a recess 154 formed by the axial offset A (FIG. 2).

Figure 4:
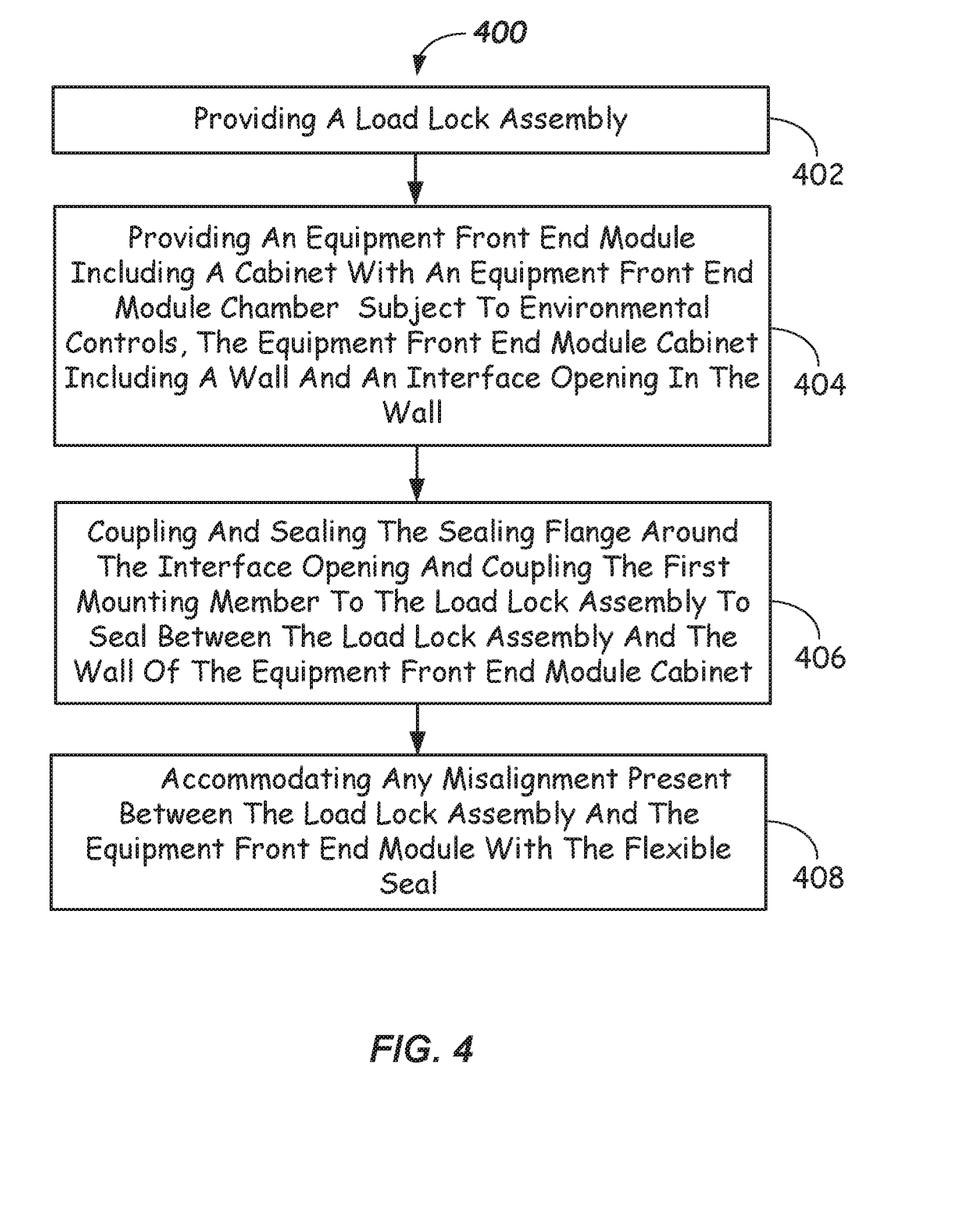
FIG. 4 illustrates a flowchart depicting a method of installing an EFEM to a load lock according to one or more embodiments.

Referring now to FIG. 4, a method of assembling a load lock assembly to an equipment front end module will be described. The method 400 includes, in 402, providing a load lock assembly (e.g., load lock assembly 105) and, in 404, providing an equipment front end module (e.g., EFEM 103) including a cabinet (e.g., cabinet 103C) with an equipment front end module chamber (e.g., EFEM chamber 142) subject to environmental controls, the equipment front end module cabinet including a wall (e.g., wall 109) and an interface opening (e.g., interface opening 108) in the wall.

The method 400 further includes, in 406, providing an equipment front end module interface (e.g., EFEM interface 100) including a first mounting member (e.g., first mounting member 102) and a flexible seal (e.g., flexible seal 104) coupled to the first mounting member, the flexible seal including a sealing flange (e.g., sealing flange 106).

The method further includes, in 408, coupling and sealing the sealing flange (e.g., sealing flange 106) around the interface opening (e.g., interface opening 108) and coupling the first mounting member (e.g., first mounting member 102) to the load lock assembly (e.g., load lock assembly 105) to seal between the load lock assembly and the wall (e.g., wall 109) of the cabinet (e.g., cabinet 103C), and, in 408, accommodating any misalignment present between the load lock assembly (e.g., load lock assembly 105) and the equipment front end module (EFEM 103) with the flexible seal (e.g., flexible seal 104).

The various parts of the method may be accomplished in any suitable order. For example, in some embodiments, the coupling and sealing of the sealing flange 106 around the interface opening 108 may occur first, and the coupling of the first mounting member 102 to the load lock assembly 105 may occur second. In one installation method, a mainframe 122 includes the load lock assembly 105 mounted thereto, and the mainframe 122 is fixedly mounted to the floor in a known position. The EFEM 103 having the EFEM interface 100 mounted thereon may then be moved towards the load lock assembly 105 and when the EFEM 103 is in the proper position for the existing floor connections, the first mounting member 102 of the EFEM interface 100 is coupled to the load lock assembly 105. Any misalignment between the load lock assembly 105 and the EFEM 103 is accommodated by the EFEM interface 100, including axial misalignment, vertical misalignment, lateral misalignment and tilting misalignment is accommodated with the flexible seal 104.

Embodiments of the present disclosure may include one or more of the following advantages. The EFEM interface 100 allows the connection between the load lock assembly 105 and the EFEM 103 to be made more efficiently because the locations of the EFEM 103 and the load lock assembly 105 can be less precisely aligned. Moreover, the flexible seal 104 of the EFEM interface 100 allows relatively large axial misalignment between the wall 109 of the EFEM 103 and the location of the load lock assembly 105. Advantageously, tilting, lateral, and/or vertical misalignment can also be accommodated. In some embodiments, the flexing of the flexible seal 104 of the EFEM interface 100 may reduce stresses imparted to the load lock assembly 105 upon installation. In cases of retrofit of a non-environmentally controlled EFEM with an environmentally-controlled EFEM 103, which may be slightly larger, the same mounting locations in the floor may be used for both. Furthermore, the use of the EFEM interface 100 provides air-tight sealing between the EFEM 103 and the load lock assembly 105 when the EFEM 103 includes environmental controls 144.

The foregoing description discloses example embodiments of the disclosure. Modifications of the above-disclosed apparatus, systems, and methods which fall within the scope of the disclosure will be readily apparent. Accordingly, while the present disclosure includes certain example embodiments, it should be understood that other embodiments may fall within the scope of the disclosure, as defined by the appended claims.

What is claimed is:

1. An equipment front end module interface, comprising:
a first mounting member configured to couple to a load lock assembly; and
a flexible seal coupled to the first mounting member, the flexible seal including a sealing flange configured to seal around an interface opening in an equipment front end module.

2. The equipment front end module interface of claim 1 wherein the sealing flange comprises an outer gasket portion including a plurality of mounting holes.

3. The equipment front end module interface of claim 2 wherein at least some of the plurality of mounting holes are elongated.

4. The equipment front end module interface of claim 1 wherein the sealing flange comprises a plurality of ridges surrounding the first mounting member.

5. The equipment front end module interface of claim 1 wherein the first mounting member comprises a rectangular plate including a substrate opening, the first mounting member configured to receive and couple the load lock assembly about the substrate opening.

6. The equipment front end module interface of claim 5, wherein the substrate opening is located on an upper half of the rectangular plate.

7. The equipment front end module interface of claim 1, wherein a first plane of a sealing surface of the first mounting member and a second plane of a sealing surface of the flexible seal are offset axially from one another when the flexible seal in an unflexed condition.

8. The equipment front end module interface of claim 1, wherein the flexible seal is configured to flex from an unflexed condition and allow axial misalignment of greater than +/−10 mm.

9. The equipment front end module interface of claim 1, wherein the flexible seal is configured to flex from an unflexed condition and allow one or more of lateral misalignment, vertical misalignment, or tilting misalignment.

10. An equipment front end module, comprising:
a cabinet including an equipment front end module chamber subject to environmental controls, the cabinet including a wall with an interface opening; and
an equipment front end module interface coupled to the wall, the equipment front end module interface comprising:
a first mounting member configured to couple to a load lock assembly, and
a flexible seal coupled to the first mounting member, the flexible seal including a sealing flange that is sealed around the interface opening.

11. The equipment front end module of claim 10, wherein the wall includes an interface panel including the interface opening, wherein the equipment front end module interface is mounted in the interface opening.

12. The equipment front end module of claim 11, comprising at least two interface openings formed in the interface panel, wherein the equipment front end module interface is mounted in a first one of the at least two interface openings, and a second equipment front end module is mounted in a second one of the at least two interface openings.

13. The equipment front end module of claim 11, wherein the sealing flange that is sealed around the interface opening in the wall is compressed onto a sealing surface of the wall by a clamp.

14. The equipment front end module of claim 13, wherein the clamp comprises a plurality of clamping strips wherein each one of the plurality of clamping strips is secured along one side of the interface opening.

15. The equipment front end module of claim 14, wherein the plurality of clamping strips are secured to an interface panel by fasteners received through apertures formed in the sealing flange.

16. The equipment front end module of claim 10, wherein the first mounting member is coupled to a first slit valve assembly of the load lock assembly.

17. The equipment front end module of claim 10, wherein the first mounting member comprises a plate including a substrate opening and including a slit valve sealing surface wherein a slit valve assembly is sealed to the slit valve sealing surface.

18. The equipment front end module of claim 17, wherein the substrate opening is offset on the first mounting member and an actuator of the slit valve assembly is received in a recess formed by an axial offset of the flexible seal.

19. An electronic device processing apparatus, comprising:
- a mainframe;
- the load lock assembly coupled to the mainframe; and
- the equipment front end module of claim 10 comprising the flexible seal coupled to the load lock assembly.

20. A method of assembling a load lock assembly to an equipment front end module, comprising:
- providing a load lock assembly;
- providing an equipment front end module including a cabinet with an equipment front end module chamber subject to environmental controls, the cabinet including a wall and an interface opening in the wall;
- providing an equipment front end module interface including a first mounting member and a flexible seal coupled to the first mounting member, the flexible seal including a sealing flange;
- coupling and sealing the sealing flange around the interface opening and coupling the first mounting member to the load lock assembly to seal between the load lock assembly and the wall of the cabinet; and
- accommodating any misalignment present between the load lock assembly and the equipment front end module with the flexible seal.

* * * * *